United States Patent Office 3,536,489

Patented Oct. 27, 1970

3,536,489

HETEROCYCLIC IMINOAROMATIC-HALOGEN CONTAINING PHOTOINITIATOR LIGHT SENSITIVE COMPOSITIONS

George H. Smith, Maplewood, Minn., assignor to Minnesota Mining and Manufacturing Company, St. Paul, Minn., a corporation of Delaware No Drawing. Filed Sept. 16, 1966, Ser. No. 579,816

Int. Cl. G03c *1/68*

U.S. Cl. 96—28 10 Claims

ABSTRACT OF THE DISCLOSURE

Exposure to a light-image of a coating containing a heterocyclic iminoaromatic compound and a halogen-containing photoinitiator forms a distinguishable image by polymerization at light-struck areas.

This invention relates to photopolymerization and in particular to novel photopolymerizable compositions and articles made therewith. One important field of utility is in connection with the recording of light-images. There is provided a coated sheet material which, when exposed to a light-pattern, undergoes polymerization at the light-struck areas to make possible the formation of a permanent visible record of the light-image.

The photopolymerizable compositions and coatings of this invention consist essentially of one or more heterocyclic iminoaromatic compounds having the structural formula

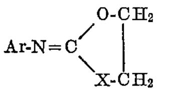

wherein Ar is aryl, X is $CH_2$ or NR, and R is H or lower alkyl, together with at least one organic halogen-containing photoinitiator compound in amounts of at least about one-tenth the weight of the imine, and including a hydrogen donor material. Preferably the coatings will contain additional components such for example as film-forming binders, sensitizing dyes, coloring or opacifying agents, tackifiers, plasticizers or softeners, fusible particles or other modifiers, diluents or extenders. The amount and kind of such additives may cover a wide range, provided only that the heterocyclic imine and the photoinitiator are present in sufficient concentration to produce a developable differential under localized exposure to actinic radiation and that the additives do not inhibit the polymerization. Although unsupported films are also contemplated, the sheet materials of the invention will ordinarily include a carrier or backing such as paper, film or foil, the photopolymerizable composition being present as a thin uniform coating or deposit on a major surface thereof.

The visible image may be formed during the exposure or during subsequent heating, for example by heat-induced fusion and transparentization of the initially opaque film at exposed areas to permit viewing of a contrasting surface therebeneath. The visible image may be developed on the exposed surface, for example by application of a liquid or powder which is selectively retained on one or the other of the exposed or underexposed portions, or by selective solution or swelling of the exposed or underexposed portions. A presently preferred procedure involves selective transfer of one or the other of the exposed or underexposed portions of the coating either partially or entirely to a suitable receptor surface where the transferred material may then if desired be made more readily visible by toning with a liquid or powder, or by chemical reaction, or by any other applicable procedure. More specifically, it is preferred to expose the sensitive sheet briefly to a light-image, to continue the polymerization by moderate application of heat while the exposed surface is in contact with a receptor sheet, and to develop or make visible the areas of the receptor sheet corresponding to the underexposed areas of the sensitive sheet by application of an image toner or developer in powder form.

The organic halogen-containing photoinitiator compounds are substantially neutral, i.e. neither acidic nor basic, and in the absence of actinic radiation are chemically inert toward the monomer system employed. In addition they are of sufficiently low vapor pressure to remain in the coating prior to photolysis, and are sufficiently stable to avoid undergoing decomposition under all normal storage conditions. On exposure to actinic radiation such as ultraviolet radiation, or visible light when employed in conjunction with suitable sensitizing dyes, these compounds undergo dissociation at one or more of the carbon-halogen bonds.

The halogen-containing photoinitiator may itself be a hydrogen halide precursor which decomposes on exposure to light to cause the formation of hydrogen halide, or may serve as a source of halogen with which hydrogen from some other hydrogen donor component may then combine to form hydrogen halide, such sources being present in the imino compound itself, in the organic binder ordinarily employed as viscosity control agent or carrier, in the plasticizers or traces of solvent remaining in the coating, or from other sources.

Although the reaction mechanism is not known with certainty, it is suggested that the presence of halogen acids produced in consequence of the dissociation of the halogen-containing photoinitiator results in an opening of the heterocyclic ring followed by inter-reaction of the ring residues to form products of increased molecular weight and of different softening point and reduced solubility. But regardless of mechanism, it has been discovered that compositions and coatings as here described and defined are capable of recording light-images by a simple process involving exposing the coating to the image to cause a polymerization and change in physical properties at the light-struck areas, and effecting a visual contrast between the image and non-image areas to develop a permanent visible record.

The term "light-image" will here be defined as including ultraviolet or other actinic radiation as well as radiation in the visible range.

The following examples will further illustrate the practice of the invention.

EXAMPLE 1

A solution of 0.5 gm. of 2-(1-naphthylimino)-3-methyl-1,3-oxazolidine and 0.18 gm. of tribromomethylquinoxaline in 20 ml. of acetone is applied with a coating knife at an orifice of 2 mils in a smooth uniform layer on 30 lb./ream map overlay tracing paper and the coating is dried, the entire operation being conducted in the substantial absence of actinic radiation. The coated surface is exposed for 15 seconds through a partial mask to radiation from a BH–6 1000-watt high pressure mercury arc lamp at a distance of ten inches. The mask is replaced with a sheet of white bond paper and the two-sheet composite is heated between flat platens for five seconds at 125° C. The bond paper is stripped from the coated surface and is dusted with a colored fusible toner powder. The powder adheres to those areas corresponding to the unexposed portions of the coated surface. Any loose powder is removed by shaking, brushing, or blowing, and the sheet is heated to fix the powder image. A permanent visible record of the mask and light-image results. The method may be applied to printed masks, stencils, photographic transparencies, or other suitable sources of light-images.

EXAMPLE 2

To one ml. of a solution of 3.5 gm. of 2-phenylimino-1,3-oxazolidine in 100 ml. of acetone is added six mgm. of tribromomethylquinoxaline, four drops of a solution of ten grams of cellulose acetate butyrate in 100 ml. of acetone, and four drops of a solution of one gram of 3,3-diethyloxycarbocyanine in 100 ml. of methanol. The solution is prepared, applied to map overlay tracing paper by whirl coating, and dried, all under darkroom conditions. The coated surface is exposed through a partial mask for 20 seconds to light at 10,000 foot-candle intensity obtained from a tungsten filament projection lamp. The sheet is heated against bond paper which is then removed and treated with powder as described in Example 1 to form a permanent visible record of the light-image.

EXAMPLE 3

A solution of 0.1 gm. of 2-phenylimino-1,3-oxazolidine and 0.015 gm. of iodoform in 2 ml. of acetone is whirl coated on an aluminum plate previously treated with dilute sodium silicate, washed and dried. The coated surface is exposed through a partial mask to radiation from the mercury vapor lamp at ten inches for one minute. The surface is then washed with water to remove the unexposed portions of the coating, and is wiped with fountain solution and inked out with lithographic ink. A number of copies are produced on white paper by the lithographic printing process.

EXAMPLE 4

2-N-phenylimino-3-methyl-1,3-oxazolidine, .05 gm.
Tribromomethylquinoxaline, .012 gm.
Binder (cellulose acetate butyrate) about .015 gm.
Whirl coat on paper from solution in acetone, and dry.
Expose to mercury vapor lamp at 10 inches for one minute.
Heat in contact with bond paper for about five seconds at 100° C.
Develop with colored powder as in Example 1.

A permanent visible record is obtained.

EXAMPLE 5

Same as Example 4 except that the imine is 2-(4′-ethoxyphenylimino)-3-methyl-1,3-oxazolidine, the photosensitizer is 0.025 gm. of trichloroacetanilide, and the transfer temperature is 110° C. A permanent visible record is obtained.

EXAMPLE 6

The photosensitive coating contains 2-(4′-chlorophenylimino)-3-methyl-1,3-oxazolidine and tribromomethylquinoxaline. A visible record is obtained by the procedures described under Example 1.

EXAMPLE 7

A composition containing 0.5 gm. of 2-(4′-chlorophenylimino)-3-methyl-1,3-oxazolidine, 0.18 gm. of tribromomethylquinoxaline, three drops of a solution of five grams of cellulose acetate butyrate in 100 ml. of acetone, seven drops of a solution of one gram of "Seto Flavin T" dye having a color index number 49005, and 20 ml. of acetone, is whirl coated on a carrier and dried. Exposure to a light-image from a tungsten filament source for one-half minute at about 11,000 foot-candles produces a sufficient differential to permit selective transfer at unexposed areas to a paper receptor sheet by brief heating at 110° C. The transferred record is developed with toner powder and fixed as in Example 1.

Other examples showing equally effective image-recording properties employ coatings of compositions containing 0.05 gram of 2-N-(p-chlorophenylimino)-tetrahydrofurane plus 0.025 gram of any one of the following halogen-containing organic photoinitiators:

hexachloro-p-xylene
1,2,3,4-tetrabromobutane
tribromoquinaldine
hexabromoethane

In the foregoing examples and in the claims, the term "unexposed" is used to indicate absence of deliberate exposure. Even though some incidental exposure may occur, the "unexposed" (or underexposed) areas remain comparatively unaffected, so that an effective differential in physical properties between the two areas of the photosensitive stratum is achieved.

What is claimed is as follows:

1. An article adapted for use in recording a light-image and having a photosensitive stratum consisting essentially of at least one heterocyclic iminoaromatic compound having the structural formula

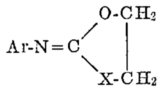

wherein Ar is aryl, X is $CH_2$ or NR, and R is H or lower alkyl, together with at least one substantially neutral and stable organic halogen-containing photoinitiator compound having photodissociable carbon-halogen bonds, said photoinitiator being present to the extent of at least about one-tenth the weight of said heterocyclic compound.

2. The article of claim 1 wherein the photosensitive stratum is in the form of a thin uniform coating on a flexible carrier.

3. The article of claim 1 wherein the photosensitive stratum includes a film-forming polymeric binder.

4. The article of claim 1 wherein the photosensitive stratum includes a sensitizing dye and is photosensitive within the range of visible light.

5. The method of recording a light-image comprising: exposing to a light-image an article having a photosensitive stratum as defined in claim 1 and consisting essentially of at least one heterocyclic iminoaromatic compound having the structural formula

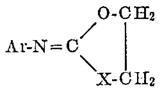

wherein Ar is aryl, X is $CH_2$ or NR, and R is H or lower alkyl, together with at least one substantially neutral and stable organic halogen-containing photoinitiator compound having photodissociable carbon-halogen bonds and present in an amount equal to at least about one-tenth the weight of said heterocyclic compound, to an extent sufficient to induce a polymerization and effect a differential in physical properties between the exposed and unexposed areas in said stratum; and utilizing said differential in the development of a visible record of said light-image.

6. The method of claim 5 wherein the visible record is developed by a procedure including effecting a physical separation between the exposed and the underexposed areas of said stratum.

7. The method of claim 6 wherein separation is effected by transfer at underexposed areas to a receptor surface.

8. The method of claim 7 wherein the transferred portions of said stratum are powder-developed.

9. The article of claim 1 wherein said photoinitiator compound is hexabromoethane.

10. The article of claim 4 wherein said photoinitiator compound is tribromomethylquinoxaline and said sensitizing dye has a Color Index number of 49005.

References Cited

FOREIGN PATENTS 1,302,340 7/1962 France.

NORMAN G. TORCHIN, Primary Examiner

R. E. FICHTER, Assistant Examiner

U.S. Cl. X.R.

96—35, 48, 115